United States Patent [19]

Morrison

[11] Patent Number: 4,654,110
[45] Date of Patent: Mar. 31, 1987

[54] TOTAL IMMERSION CRYSTAL GROWTH

[75] Inventor: Andrew D. Morrison, Altadena, Calif.

[73] Assignee: The United States of America as represented by the Administrator of the National Aeronautics and Space Administration, Washington, D.C.

[21] Appl. No.: 674,395

[22] Filed: Nov. 21, 1984

Related U.S. Application Data

[63] Continuation-in-part of Ser. No. 442,815, Nov. 18, 1982, abandoned.

[51] Int. Cl.$^4$ ............................................. C30B 27/02
[52] U.S. Cl. ............................... 156/607; 156/617 H; 156/617 SP
[58] Field of Search ......... 156/601, 607, 608, 617 SP, 156/617 H, 619, DIG. 97, DIG. 70, DIG. 73; 422/246, 249

[56] References Cited

U.S. PATENT DOCUMENTS

| | | | |
|---|---|---|---|
| 3,857,679 | 12/1974 | Allred | 422/249 |
| 3,980,438 | 9/1976 | Castoguoy et al. | 156/617 SP |
| 4,225,378 | 9/1980 | Garrison | 156/608 |
| 4,329,195 | 5/1982 | Kudo | 156/DIG. 97 |
| 4,483,735 | 11/1984 | Inada et al. | 156/607 |

OTHER PUBLICATIONS

Weiner et al., Journal of Electrochem. Soc. vol. 118, No. 2 (Solid State Science), 2/77, pp. 301–306.
Nygren et al., Journal of Electrochem. Soc.: Solid State Science vol. 118, No. 2, pp. 306–312.

Primary Examiner—John Doll
Assistant Examiner—Robert M. Kunemund
Attorney, Agent, or Firm—Paul F. McCaul; Thomas H. Jones; John R. Manning

[57] ABSTRACT

Crystals of wide band gap materials are produced by positioning a holder (106, 274) receiving a seed crystal (106) at the interface (36, 270) between a body (26, 206) of molten wide band gap material and an overlying layer (28 or 288) of temperature-controlled, encapsulating liquid. The temperature of the layer decreases from the crystallization temperature of the crystal at the interface with the melt to a substantially lower temperature at which formation of crystal defects does not occur, suitably a temperature of 200° C. to 600° C. After initiation of crystal growth, the leading edge of the crystal (212) is pulled through the layer until the leading edge of the crystal enters the ambient gas headspace (30, 265) which may also be temperature controlled. The length of the column of liquid encapsulant may exceed the length of the crystal such that the leading edge and trailing edge of the crystal are both simultaneously with the column of the crystal.

The crystal can be pulled vertically by means of a pulling-rotation assembly (20) or horizontally by means of a low-angle withdrawal mechanism (210). The temperature of the encapsulating layer is controlled by heating and/or cooling elements (35, 230) submerged with the layers and connected in closed loop with power supplies (50, 52, 240) by means of temperature sensing elements (52, 239). These elements control and provide nucleation and growth of a more perfect crystal in the elongated, heat exchange, encapsulating fluid medium.

13 Claims, 2 Drawing Figures

TOTAL IMMERSION CRYSTAL GROWTH

ORIGIN OF THE INVENTION

The invention described herein was made in the performance of work under a NASA contract and is subject to the provisions of Section 305 of the National Aeronautics and Space Act of 1958, Public Law 83-568 (72 Stat 435; 42 USC 2457).

CROSS-REFERENCE TO RELATED APPLICATION

This application is a continuation-in-part of co-pending application Ser. No. 442,815, filed Nov. 18, 1982 and now abandoned.

TECHNICAL FIELD

The present invention relates to growing of crystals and, more particularly, this invention relates to the growth of single crystals from a melt covered with an encapsulating fluid.

BACKGROUND ART

A wide variety of devices are currently under development utilizing the wider band gap materials such as gallium arsenide or gallium phosphide which provide high intrinsic electron mobility at low fields. Electron mobility of gallium arsenide is between five and six times that of silicon and offers the prospect of greatly increased performance in speed, power or both.

The low field electron mobility of GaAs is one of its greatest attributes and offers high frequency operation in devices such as the field effect transistor (FET). The technology of manufacturing high performance GaAs (FET's is maturing at a rapid rate and the devices are experiencing a greatly expanding role in oscillator, mixer, logic element, power amplification and low noise/high gain applications especially in satellite communications, military weapon systems, IC test equipment and mainframe computers. However, the full potential has yet to be realized by substrate suppliers and device manufacturers Present crystal preparation methods do not provide reliable and reproducible high performance devices.

The wider band gap materials, such as gallium arsenide, are all compounds which are subject to complex binary phase equilibria. In every case, one component of the compound, i.e., arsenic, is volatile. Escape of arsenic from the growing crystal causes crystal dislocation defects and vacancies which affect the parameters of the bulk crystal and also affect the structure and performance of epitaxial layers grown on the surface of the crystal.

Precise control of the As vapor pressure in the chosen growth system is required in order to maintain exact stoichiometry of the gallium arsenide compound during the growth process so as to achieve high mobility and crystal perfection.

One process utilized for commercial production of bulk gallium arsenide compound reduces arsenic related defects by providing a high arsenic vapor pressure. A source of arsenic is vaporized and reacts with gallium metal in a sealed quartz ampoule. This is followed by single crystal growth initiated and controlled by establishing thermal gradients for crystal growth across the ampoule (horizontal Bridgemen). The resulting semicircular wafers are small and are not compatible with wafer handling equipment developed for the silicon IC industry. Furthermore, the wafers are of poor quality and still exhibit high inherent defect densities.

These substrates offer poor and unpredictable quality and exhibit high inherent defect densities. A common manifestation of poor quality is the formation of a conductive surface layer following a thermal annealing process step. Excessive surface conduction results in parasitic conductance paths between drain and source regions of adjacent transistors. These spurious conductance paths degrade device performance and cause incorrect circuit operation. This surface conductive layer may result from a redistribution of impurities during the thermal annealing process step.

The initial thrust of GaAs IC development activities required the growth of an epitaxial GaAs IC layer whose quality was directly dependent upon the quality of the substrate material. The large defect densities inherent in the Bridgeman crystal material would directly propagate into the epitaxial layer during its growth phase. The unpredictable and generally poor quality of this material proved a major stumbling block in GaAs IC development.

A much better method of growing crystals is to pull a crystal from a melt according to the Czochralski method which is the standard method for growing most of the device grade silicon. This method cannot be utilized to grow crystals from compounds having volatile components at the crystallization temperature such as gallium arsenide unless the melt is encapsulated with a thin layer of inert liquid such as boric oxide and pressurizing the chamber with an inert gas such as argon or nitrogen. This non-reactive high pressure atmosphere counterbalances the arsenic dissociation pressure. Typical gas pressures during operation can exceeed 30 atmospheres and require adequate safety precautions during use of the crystal pulling equipment.

The crystal pulling equipment is readily available for use in this liquid encapsulated crystal (LEC) technique. Larger crystals with lower levels of background impurities are produced than typical Bridgeman crystal material. Yields are also significantly higher and this method has proved quite successful and has become commercially feasible.

The LEC technique was first demonstrated by Metz et al in J. Appl. Phys., 33 (1962), 2016. The first reports of growth of GaAs and InAs crystals were by Mullin et al in J. Phys. Chem. Solids, 26 (1962), 782, and Bass et al in Symposium on GaAs (Institute of Physics and Physical Society of London), 1967, 41. The encapsulation layer must be less than 1.5 cm thick or control becomes very difficult as indicated by Thyagarajan et al in Indian J. of Pure and Appl. Phys., 17, Oct. 1979, 650. The temperature gradient at the interface is important since the growing crystal leaves the molten encapsulant environment where radiation heat transfer controls and enters the ambient inert gas where convective heat transfer processes control.

Russ in Solid State Technology, Aug. 1972, 29, 31 also reports on the need for temperature control and on the rapid heat loss associated with pulling a crystal from the melt through the thin liquid encapsulant into the gas atmosphere. Russ also reports that the growth process is inhibited if the $B_2O_3$ layer is over 2 cm thick. Johnson produced a polycrystalline GaAs by liquid encapsulated floating zone (EFZ) by multiple pass melting of a GaAs rod in a floating zone of $B_2O_3$ (J. Crystal Growth 30 [1975] 249–256).

The product of liquid encapsulated growth (LEC) is a single crystal containing substantial stress and stress artifacts (such as dislocations) due to extreme thermal gradients experienced by the growing crystal. The LEC produced crystals are also characterized by inclusions of gallium in the surface of the crystal due to evaporation of arsenic or phosphorous from the surface of the crystal while it is at elevated temperatures when it exits the boric oxide encapsulant. It is believed that crystal defects can be reduced if the thermal gradients in the growing crystal can be closely controlled to reduce the formation of defects and also to prevent the loss of one of the constituents of the compound until the crystal has cooled to a point where it is stable.

DISCLOSURE OF THE INVENTION

High quality crystals of wide band gap III-V materials are produced in accordance with this invention by pulling the crystal from the melt into a long temperature controlled column of liquid encapsulant long enough to maintain the crystal submerged until the crystal is relatively cool. In one embodiment of the process the length of the column of encapsulant exceeds the length of the single crystal such that crystal growth is terminated and the trailing edge of the crystal separates from the melt and enters the column of encapsulant while the leading edge of the crystal is still submerged in encapsulant. This breaks the thermal conduction path between the melt and the crystal reducing thermal gradients and stress in the crystal. Heating and/or cooling elements can be submerged in the column of encapsulant to precisely control and controllably lower the temperature of the liquid in contact with the crystal.

This accomplishes a variety of tasks. One, the volatilization of one component of the crystal is inhibited by encapsulation until the crystal is relatively cool. Second, stresses caused by extreme thermal gradients along the length of the crystal can be reduced by making the environment around the crystal have the temperature gradient most optimum for defect-free growth.

The wide temperature range over which the boric oxide or other encapsulant remains molten makes possible the use of the encapsulant to provide active and passive control of the temperature. The higher heat capacity of a liquid as compared to a gas also provides a more sensitive and efficient medium for transmitting or extracting heat from the growing crystal. The apparatus utilized to sense gas temperature can be utilized to sense the temperature of the thick column of encapsulant and to operate the submersed heating and cooling elements. Imaging systems such as X-ray, optical or sonar may be required to observe the growth of crystal since the encapsulant may turn opaque.

The vertical pulling process produces an ingot that is sliced to form the wafers utilized as substrates for device manufacture. This can result in up to 50 percent loss in the swarf dust generated on sawing the ingot into slices. Since GaAs is about five times as expensive as silicon, it is even more important to avoid any loss of crystal material. The invention also relates to a method of horizontally growing a sheet of wide band gap compound while encapsulated along its length until solidified between two immiscible liquids, i.e., the melt of the compound and an inert liquid encapsulant.

The process of this invention permits direct continuous, semicontinuous or batch growth in sheet form of gallium arsenide or gallium phosphide or any other material in which a two immiscible liquid system can be identified. The process is simple. It includes encapsulating a melt of the desired material, gallium arsenide, or gallium phosphide in this case, under a liquid which is not only immiscible with the melt, but also which has a lower melting point than the melt. Controlled cooling of the encapsulating liquid will in turn cool the melt along the liquid/liquid interface. When the lower encapsulated melt liquid cools below its crystallization point, a crystalline film will solidify. Crystallization can be seeded by insertion of a seed through the encapsulating liquid and single crystal growth will proceed. Continuous withdrawal of the seeded film will produce a ribbon. The process can be operated continuously by replenishing the withdrawn melt. However, impurities will concentrate in the encapsulant and the melt. Highest quality product is produced by forming a sheet or ingot of ribbon from a batch of melt and pulling the ribbon or ingot until only a minor amount of melt, usually 5 to 10 percent by weight, remains in the crucible. The encapsulant and remaining melt are discarded before recharging the crucible for the next run. The product of this process can be tailored to be close to the final sheet form needed for device application. Controlled thermal gradients in the encapsulating fluid may produce a ribbon of higher crystalline perfection than the Czochralski crystals currently grown.

The apparatus for growing crystalline sheet according to this invention is relatively simple. A high pressure crystal growth furnace such as is currently used today for the liquid encapsulated growth by the Czochralski method of these compounds may be modified to hold an elongated flattened crucible and a low-angle crystal withdrawal mechanism. The usual temperature controls would be supplemented with a closed-loop sensor and an active cooling and/or heating element control system to adjust the melt temperatures in the encapsulant. The crystal growth process would proceed very much in the manner of the low-angle silicon sheet growth process except that the ambient into which the crystal grows would be a fluid with active or passive thermal modifiers, rather than a gaseous ambient.

These and many other features and attendant advantages of the invention will become apparent as the invention becomes better understood by reference to the following detailed description when considered in conjunction with the accompanying drawings.

DETAILED DESCRIPTION OF THE INVENTION

Figure 1:
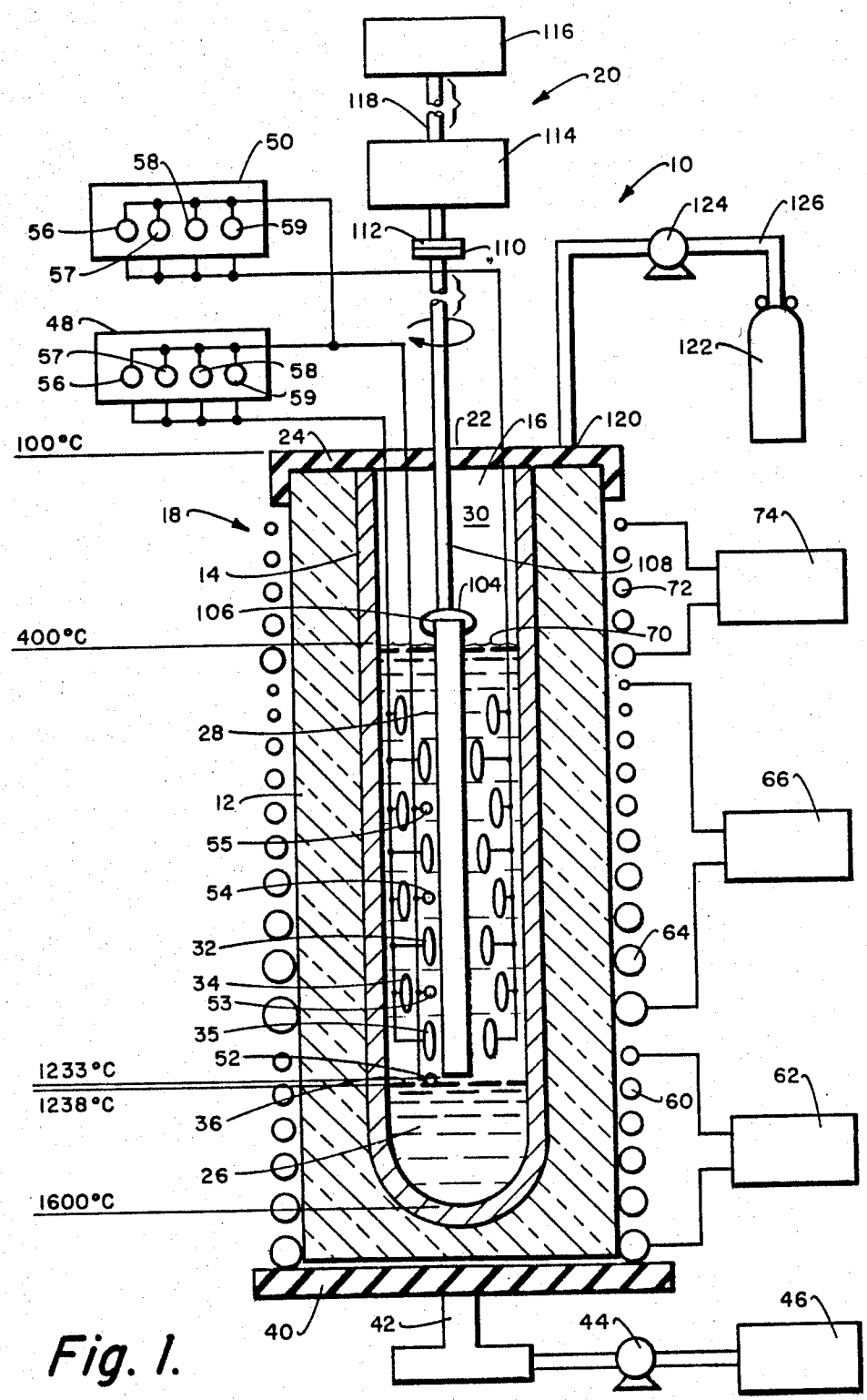
FIG. 1 is a schematic view of a first embodiment of a system in accordance with the invention for pulling a crystal.

The process of the invention is most useful for forming single crystals of wide band gap materials having band gaps exceeding 1.0 e.V. preferably from 1.5 e.V. to 4.0 e.V. The invention is particularly directed to the III-V compounds having a volatile component such as gallium arsenide, indium arsenide, gallium phosphide, indium phosphide and various ternary and quaternary combinations such as gallium indium arsenide phosphide (GaInAsP). Gallium arsenide melts at about 1200° C. at atmospheric pressure and typical growth conditions will be at low pressure of about 5 psig to two atmospheres. Gallium phosphide melts at 1470° C. at about 32 atmospheres.

In order for an encapsulant to operate effectively, it must float on top of the melt and be inert to the melt and crucible. The ideal properties for an encapsulant are a lower density than the underlying melt and inertness and unreactivity with the melt and with the crucible. The encapsulant should be transparent so that the growth interface can be observed. Compounds should be low melting, have low vapor pressure, high purity and must wet both the melt and the crucible. Graphite has been found to be the most effective material for use as a susceptor cup and the crucible may be formed of pure fused quartz.

For the growth of gallium arsenide (Density=5.3 g/cc) or gallium phosphide (Density=4.1 g/cc) in a quartz crucible, boric oxide has been found to be the most effecive encapsulant. Properties of boric oxide are provided in the following table:

TABLE I

| Property | Value |
| --- | --- |
| Density | 1.8 g/cc |
| Melting point | 450° C. |
| Vapor pressure | 1 mm at 1240° C. |
| Low reactivity with quartz, gallium arsenide, gallium phosphide | |
| Reacts with water | |

In the process of the invention the melt and the overlying column of liquid encapsulant are disposed in a common elongated crucible. The melt compound is heated over a temperature gradient from a high temperature at the walls of the crucible exceeding the melting point by several hundred degrees and decreasing to the interface with the encapsulant to a temperature near the crystallization temperature. This heating is suitably provided by external coils which heat the susceptor by inductance heating. Resistance heating may also be used. The interface is at a temperature slightly below the crystallization point usually within 5° C. thereof. The liquid encapsulant column has a temperature profile also decreasing gradually from the melting temperature at the interface with the melt to a temperature at which the formation of crystal defects has terminated and the leading edge of the crystal can enter the inert gas headspace without inducing unacceptable stresses, suitably a temperature from 200° C. to 600° C. The crystal remains in the gas ambient until it has reached a temperature at which it can safely enter room temperature ambient without cracking, generally a temperature from 50° C. to 150° C.

Typical growth conditions are provided in the following table:

TABLE II

| Parameter | GaAs | GaP |
| --- | --- | --- |
| Temperature | 1238° C. | 1470° C. |
| Pressure | +1 Atm. | +50 Atm. |
| Ambient gas | $N_2$ | $N_2$, He |
| Cup Lift | Yes | No |
| Pull Rate | 1.5"/hr. | 1.5"/hr. |
| Cup Rotation | to 30 rpm | No |
| Seed Rotation | Yes | Yes (30 rpm) |
| Preferred Seed Orientation | (111) | (111) |
| Means of Observation | Direct | CCTV |

Referring now to FIG. 1, the system 10 for forming a single crystal generally includes a susceptor cup 12 receiving an elongated crucible 14 disposed in the chamber 16 of a pressurized vessel 18. A pulling and rotation assembly 20 is mounted over the pass-through 22 in the top 24 of the vessel 18.

The crucible 14 contains a lower melt receiving cavity 26, an elongated intermediate liquid encapsulant channel 28 and an upper head space 30. The channel 28 may contain a plurality of heating elements 32 and/or cooling elements 34. The lowermost heating element 35 is disposed adjacent the melt-encapsulant interface 36 in order to provide close control of nucleating conditions. As the crystal grows the level of the melt will lower. In order to maintain the positions of the interface 36 near the elements, the susceptor cup 12 can be mounted on a vertically translatable support 40 such as a piston 42 connected to a reservoir 46 by means of a pump 44.

The heating elements 32 are connected to a power-supply controller 48 and the cooling elements 34 are connected to a power-supply controller 50. The controllers 48, 50 may be operated in response to signals developed by thermal sensors 52, 53, 54, 55 and connected in closed-loop with the controllers 48, 50 by means of cables 56, 57, 58, 59 in order to sense and correct changes in the local temperature profile of the column of encapsulant.

The contents of the crucible 14 can also be heated by inductance coils In order to provide closer control of temperature over the wide thermal gradient present from the bottom to the top of the crucible 14, especially at the interface where crystal growth is initiated, a plurality of inductance coils may be utilized The lower coil 60 powered by controller-power supply 62 surrounds the melt receiving cavity 26 and extends up to the interface 36. The intermediate coil 64 connected to controller-power supply 66 surrounds the liquid encapsulant channel 20 extending from melt-encapsulant interface 36 to encapsulant-inert gas interface 70. The third coil 72 connected to controller-power supply 74 surrounds the headspace 30.

The temperature of the growing crystal can be further controlled by disposing a series of heating elements and/or cooling elements in the headspace. Each of the heating elements can be individually controlled by a variable power supply and each cooling element can be individually controlled by a separate variable power supply.

The assembly 20 includes a rod having a lower seed holder 104 for holding a seed crystal 106 and a shaft 108 terminating in an upper keyed end 110 received in a chuck 112. The chuck is attached to rotation means such as a motor 114. The motor assembly 114 may in turn be connected to a pulling assembly 116 by rod 118.

The chamber 16 of the vessel 18 is pressurized by means of an inlet 120 connected to the top and to a source 122 of inert gas and a pump 124 by means of pipe 126.

The system can be operated by placing preformed compound into the crucible or by forming the compound in situ by co-melting and reacting elemental metal such as gallium and anion precursor such as arsenic under molten encapsulant under inert pressure. Pyrolytic boron nitride (PBN) crucibles are found to introduce less impurities than quartz crucibles.

A procedure for operating the system starts with cleaning the crucible by an acid etch, wash and vacuum evacuation of the chamber. Stoichiometric quantities of high purity gallium and arsenic are charged into the crucible. Dehydrated, purified boric oxide pellets are placed on top of the charge sufficient to form a column of liquid at least 2 cm, usually from 5 to 50 cm, in height. The volume of the $B_2O_3$ should exceed the volume of the melt so that the height of encapsulant always exceeds the height of the crystal. The three controller-power supplies to the coils are then activated, the top of the vessel clamped to close the chamber which is then activated and placed under vacuum while being slowly heated to about 300° C. but below 325° C. to avoid loss of arsenic by volatization. After the compound is formed after several hours, the chamber is pressurized with inert gas and the temperature raised to about 450° C. to melt the boric oxide. The pressure is then further increased.

The variable power supplies for the internal heating and cooling elements are then activated and the controllers for the inductance coils are positioned to provide the close control of the interface and to provide the desired temperature gradient. A seed crystal is inserted into the holder and is lowered to the interface. The seed crystal can be rotated concurrently or countercurrently with respect to the crucible. On observation of crystal nucleation and growth, the seed crystal is pulled upwardly and/or the cup is lowered to pull the leading edge of single crystal upwardly continuously until the trailing edge of the crystal separates from the melt to form a rod of single crystal. The rod may be totally immersed in the column of liquid encapsulant or the leading edge of the rod may enter the gas atmosphere before the trailing edge of the rod separates from the melt. A typical temperature profile for growing gallium arsenide single crystal according to the invention is shown in the chart adjacent the apparatus.

Figure 2:
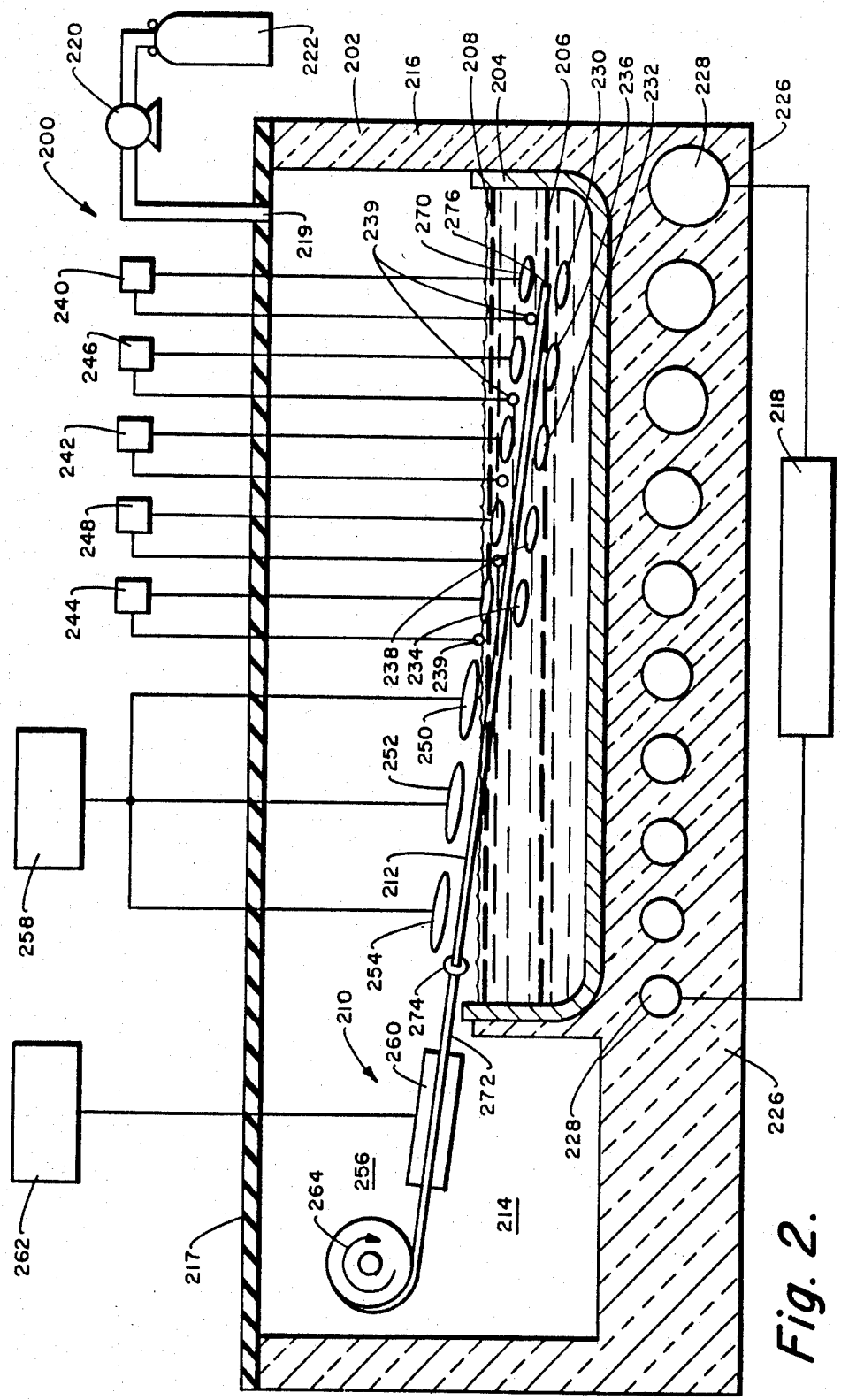
FIG. 2 is a schematic view of a further embodiment of a system for horizontally pulling single crystal in sheet form in accordance with the invention.

Referring now to FIG. 2, a system 200 for growing sheets of single crystal is illustrated. The system comprises a growth furnace 202 containing an elongated crucible 204 in which is contained a pool 206 of melt covered with a layer 208 of molten encapsulant. A low angle, crystal withdrawal mechanism 210 is utilized to pull the growing single crystal sheet 212 through the thermal gradient of the encapsulant layer 208 into the adjacent chamber 214 before being recovered.

The growth furnace 202 includes casing number 216 having a cavity receiving the elongated crucible 204. The casing is enclosed by a top 217 having an inlet 219 connected to pump 220 and a source 222 of inert gas. The bottom 226 may be provided with a heater such as a plurality of heating rods 228 inserted into channels provided into lower portion of the furnace casing 216. The individual rods may have varied heating capacity increasing toward the first end of the crucible so that a decreasing thermal gradient extends across the crucible 202. The rods are connected to a variable power supply 218.

A series of cooling elements 230, 232, 234 and heating elements 236, 238 are positioned along the line of crystal pull and within the layers of melt 206 and encapsulant 208. Each element is controlled by a heat sensor 239 connected in closed loop to a corresponding variable power supply 240, 242, 244, 246, 248. Heaters 250, 252, 254 can be provided along the line of the sheet within the headspace 256. The heaters 250, 252, 254 are connected to power supply 258. The sheet 212 then may pass through a tunnel heater 260 connected to controller 262 before being stored in the furnace or, if flexible, wound up on driven take-up reel 264.

The sheet growth system is operated by adding the melt and encapsulant forming constituents to the crucible 204 and pressuring the system by means of inert gas from supply tank 222. The controller 218 is actuated to heat rods 228 and controllers 246, 248 are turned on to actuate heating elements 236, 238. When the temperature at the interface 270 exceeds Tm and the encapsulant layer has formed, the controllers 240, 242, 244 for cooling elements 230, 232, 234 and power supplies 258 for the headspace heating elements 250, 252, 254 and power supply 262 for the heating tunnel 260 are turned on.

Reel 264 is driven in reverse to feed lead member 272 containing seed crystal holder 274 to the seed crystallizing station 276. Cooling element 230 is the most crucial element since it controls nucleation and growth of the ribbon. The array of other heating and/or cooling elements control perfection of the cooling ribbon. When the crystal growth is observed, the rotation of reel 264 is reversed and the lead member 272 is slowly pulled through the encapsulant layer 208 and in turn pulls the sheet 212 of crystal through the encapsulant 208 until a solid sheet emerges from the encapsulant into the headspace 256, past heating elements 250, 252, 254 through the tunnel 260 before being wound onto take-up reel 264.

Again, volatilization of constituents from the lower layer and from the growing crystal is reduced. Heat flow is more easily controlled and device size sheet or ribbon is readily produced.

The continuous sheet growth process eliminates the substantial waste from slicing rod into wafers. Controlled thermal gradients in the continuous liquid encapsulating environment should produce a ribbon of higher crystalline perfection than those grown by a Czochralski process.

It is to be realized that only preferred embodiments of the invention have been described and that numerous substitutions, modifications and alterations are permissible without departing from the spirit and scope of the invention as defined in the following claims

I claim:

1. A method of growing a crystal of a material having a band gap exceeding 1.0 e.V. which contains a volatile component comprising the steps of:
   forming a pool of molten precursor of said material;
   floating a layer of liquid encapsulant having a thickness of at least 5 cm. directly on top of the pool of molten precursor, said encapsulant being inert to and having a lower density than the molten precursor;
   establishing a temperature gradient in said layer decreasing from a high temperature at the interface of the pool and layer slightly below the crystallization point of the molten precursor to a substantially lower final temperature of from 200° C. to 600° C. at the top of the layer at which crystal growth has terminated;
   crystallizing the molten precursor at said interface to form the leading edge of a growing crystal;
   moving the growing crystal through said liquid layer, and
   recovering the crystal in an overlaying gas phase.

2. A method according to claim 1 in which the layer forms an elongated column having a volume exceeding the volume of the pool of molten precursor.

3. A method according to claim 1 in which heating and cooling elements are disposed in the layer to precisely control the temperature of the crystal.

4. A method according to claim 1 in which the molten precursor is a III-V compound.

5. A method according to claim 4 in which the III-V compound is selected from gallium phoshide, gallium arsenide, indium arsenide, or indium phosphide.

6. A method according to claim 1 in which the crystal is pulled horizontally through an elongated layer to form a continuous sheet.

7. A method according to claim 1 in which the liquid layer comprise boric acid.

8. A method according to claim 1 in which the layer thickness is from 5 to 50 cm.

9. A method according to claim 1 further including the step of controlling the temperature of the gas phase.

10. A method according to claim 1 in which the layer has a length exceeding the length of the crystal such that the trailing edge separated from the pool and the leading edge and trailing edge of the crystal are totally submerged in the layer before the leading edge of the crystal enters the overlaying gas phase.

11. A method according to claim 1 in which the crystal is pulled vertically through a column layer of liquid encapsulant.

12. A method according to claim 4 in which the liquid layer comprises boric acid.

13. A method according to claim 5 in which the liquid layer comprises boric acid.

* * * * *